US008771822B2

(12) United States Patent
Wang et al.

(10) Patent No.: US 8,771,822 B2
(45) Date of Patent: Jul. 8, 2014

(54) METHODS FOR THE GROWTH OF THREE-DIMENSIONAL NANOROD NETWORKS

(75) Inventors: Xudong Wang, Madison, WI (US); Jian Shi, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 183 days.

(21) Appl. No.: 13/008,170

(22) Filed: Jan. 18, 2011

(65) Prior Publication Data

US 2012/0183728 A1    Jul. 19, 2012

(51) Int. Cl.
```
D06N 7/04      (2006.01)
B82Y 30/00     (2011.01)
B82Y 40/00     (2011.01)
C30B 29/60     (2006.01)
C30B 25/18     (2006.01)
C30B 29/16     (2006.01)
C30B 25/00     (2006.01)
```

(52) U.S. Cl.
CPC ............... B82Y 30/00 (2013.01); B82Y 40/00 (2013.01); C30B 29/60 (2013.01); C30B 25/18 (2013.01); C30B 29/16 (2013.01); C30B 25/005 (2013.01)
USPC ...... 428/141; 428/367; 423/447.1; 423/447.2; 423/447.3; 423/445 B

(58) Field of Classification Search
None
See application file for complete search history.

(56) References Cited

U.S. PATENT DOCUMENTS

| | | | |
|---|---|---|---|
| 6,124,158 A | 9/2000 | Fautartas | |
| 7,022,541 B1 * | 4/2006 | Yenilmez et al. | 438/52 |
| 7,053,009 B2 | 5/2006 | Conley et al. | |
| 7,267,875 B2 * | 9/2007 | Whiteford et al. | 428/402 |
| 7,290,667 B1 * | 11/2007 | Bakajin et al. | 210/503 |
| 7,622,732 B1 * | 11/2009 | Tombler, Jr. | 257/9 |
| 2002/0121460 A1 * | 9/2002 | Moy et al. | 208/133 |
| 2004/0168627 A1 | 9/2004 | Conley et al. | |
| 2006/0159916 A1 * | 7/2006 | Dubrow et al. | 428/357 |
| 2006/0270229 A1 * | 11/2006 | Corderman et al. | 438/689 |
| 2007/0258894 A1 * | 11/2007 | Melker et al. | 424/9.1 |
| 2009/0004107 A1 * | 1/2009 | Mukherjee et al. | 424/1.89 |
| 2009/0142558 A1 * | 6/2009 | Jiao et al. | 428/206 |
| 2009/0142666 A1 * | 6/2009 | Kim et al. | 429/224 |
| 2010/0025330 A1 * | 2/2010 | Ratto et al. | 210/651 |
| 2011/0183105 A1 * | 7/2011 | Gamo et al. | 428/119 |

OTHER PUBLICATIONS

Lee et al. ("Fabrication of single-walled carbon nanotubes three-dimensional networks inside the pores of a porous silicon structure", Carbon 48, 2010, 1473—1479, published online Dec. 2009).*

Jung et al. ("High-Density, Large-Area Single-Walled Carbon Nanotube Networks on Nanoscale Patterned Substrates", J. Phys. Chem. B 2003, 107, 6859—6864).*

(Continued)

*Primary Examiner* — David Sample
*Assistant Examiner* — Nicole T Gugliotta
(74) *Attorney, Agent, or Firm* — Bell & Manning, LLC

(57) ABSTRACT

Methods for growing a three-dimensional nanorod network in three-dimensional growth spaces, including highly confined spaces, are provided. The methods are derived from atomic layer deposition (ALD) processes, but use higher temperatures and extended pulsing and/or purging times. Through these methods, networks of nanorods can be grown uniformly along the entire inner surfaces of confined growth spaces.

20 Claims, 8 Drawing Sheets

(56) References Cited

OTHER PUBLICATIONS

Homma et al. ("Growth of suspended carbon nanotube networks on 100-nm-scale silicon pilars", App Phys Lett, vol. 81, No. 12, Sep. 2002, pp. 2261-2263).*

Paulose et al., ("Anodic Growth of Highly Ordered TiO2 Nanotube Arrays to 134 um in Length", Journal of PHysical Chemistry B Lett, 2006, 110, 16179-16184).*

Vajtai et al. ("Controlled growth of carbon nanotubes", Philosophical Transactions of the Royal Society London. A 2004, 362, 2143-2160.*

Limmer et al., "A study on the growth of TiO2 nanorods using sol electrophoresis", (Journal of Meterials Science, 39 (2004) 895-901).*

Song et al., "Effect of SEe Layer on the Growth of ZnO Nanorods", (J. Phys. Chem. C 2007, 111, 596-600).*

Yang ("Self-Assembly and Ordering Nanomaterials by Liquid-phase Pulsed Laser Ablation", Chapter 6: Growth of self-assembled ZnO nanoleaf, Nov. 2007.*

Dick et al., Synthesis of branched 'nanotrees' by controlled seeding of multiple branching events, Nature Materials, May 2, 2004, vol. 3, Nature Publishing Group, pp. 380-384.

International Search Report and Written Opinion received in PCT/US2011/064212, Jul. 2, 2012.

Cheng et al., Fabrication and SERS Performance of Silver-Nanoparticle-Decorated Si/ZnO Nanotrees in Ordered Arrays, Applied Materials & Interfaces, vol. 2, No. 7, Jun. 1, 2010, pp. 1824-1828.

* cited by examiner

METHODS FOR THE GROWTH OF THREE-DIMENSIONAL NANOROD NETWORKS

CROSS-REFERENCE TO GOVERNMENT RIGHTS

The invention was made with government support under CMMI-0926245 awarded by the National Science Foundation. The government has certain rights in the invention.

BACKGROUND

Over the past two decades there have been significant advances in the development of one-dimensional (1D) nanostructures. The wire-like geometry of these structures not only introduces remarkably enlarged and well-defined crystal surfaces relative to planar structures, but also provides 1D confined channels which have the potential to fundamentally tailor the transportation of electrons, phonons and photons. Fully capturing the promising surface and transport properties of these structures in practical devices or systems, however, relies on the capability of effectively translating their extraordinary 1D characteristics into the three-dimensional (3D) space.

Current techniques for growing single-crystalline nanowires (NWs) from bottom up rely on precipitation of precursors. Next generation devices will likely require precise material chemistry in engineered three dimensional (3D) architectures. To date, however, to synthesize such a 3D nanowire array inside a highly confined space is very challenging, particularly when this space is comparable to the size of the NW itself. The challenge faced by current techniques arises from the coupling between the crystal growth rate and the precursor concentration. Due to the non-uniform distribution of precursors within a confined diffusion channels, uniform growth of NWs inside such channels is difficult.

Among all bottom-up nanostructure synthesis techniques, atomic layer deposition (ALD) is a state-of-the art approach that has a growth rate independent of the precursor concentration owing to its self-limiting surface reaction. ALD has been widely applied to grow conformal thin film coatings with precisely-controlled thicknesses down to the subnanometer level. A recent discovery has also showed that introducing metal catalysts into the ALD process can lead to the transition from conformal coatings to the vapor-liquid-solid growth of NW morphologies. (See Yang, R. B.; Zakharov, N.; Moutanabbir, O.; Scheerschmidt, K.; Wu, L. M.; Gosele, U.; Bachmann, J.; Nielsch, K. *Journal of the American Chemical Society* 2010, 132, (22), 7592-7594.)

SUMMARY

One aspect of the invention provides methods for growing crystalline nanostructures from compounds that are characterized by the ability to undergo anisotropic growth. The methods comprise the steps of exposing a substrate in a growth chamber to first precursor molecules at an elevated temperature, wherein the first precursor molecules undergo a reaction with the substrate surface or with molecules bound to the substrate surface; purging the growth chamber of the first precursor molecules; exposing the substrate to second precursor molecules at an elevated temperature, wherein the second precursor molecules undergo a reaction with the substrate or with molecules bound to the substrate; and purging the growth chamber of the second precursor molecules. These exposure and purge cycles can be repeated using exposure temperatures that are sufficiently high and purging and exposure durations that are sufficiently long such that the reactions result in the growth of a plurality of crystalline nanoparticles on the surface of the substrate. In some embodiments of the present methods, the exposure and purge cycles are repeated a sufficient number of times to grow a plurality of crystalline nanorods from the plurality of crystalline nanoparticles.

The methods are well-suited for the growth of metal oxide nanorods, such as $TiO_2$ nanorods, and can be used to grow nanorods in three-dimensional growth spaces, including highly confined growth spaces. For example, the present methods can be used to grow nanorods on a substrate surface that defines elongated channels with nanoscale diameters, wherein the nanorods are grown radially inward from the walls of the elongated channels. Alternatively, the methods can be used to grow nanorods on a substrate that comprises a matrix of nanostructures, wherein the nanorods are grown radially outward from the surfaces of the nanostructures. Examples of such matrices include those formed from aligned nanowires or from nanoscale particles.

The methods are capable for growing nanorods having sufficiently large lengths, widths and or densities that they form a three-dimensional interlinked network within the spaces in which they are grown. In some embodiments these interlinked networks are sufficiently dense to provide a free-standing, nanorod network upon removal of the growth substrate.

Thus, another aspect of the invention provides three-dimensional nanorod networks. Such networks comprise a substrate that defines one or more three-dimensional growth spaces having at least one nanoscale dimension; and a plurality of nanorods extending outwardly from the substrate surface and into the three-dimensional growth spaces, wherein the plurality of nanorods are uniformly distributed on the substrate surface in the growth spaces.

In some embodiments of the networks, the longest nanorods have lengths that are at least as long as the smallest dimension of the growth spaces. The nanorod networks can form a continuous coating on the surface of the substrate within the growth spaces and can provide very high surface areas, as measured by their roughness factor. For example, roughness factors of at least 3000 can be achieved.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

One aspect of the present invention provides methods for growing a 3D nanorod network in 3D growth spaces, including highly confined spaces. The present methods mimic the ALD process by using separated exposures of gaseous precursors, but use higher temperatures and extended pulsing and/or purging times. Through this approach, networks of nanorods can be grown uniformly along the entire inner surfaces of confined spaces.

In the present methods different precursor molecules are sequentially pulsed into a growth chamber and the precursor molecule pulses are separated by periods of purging. Thus, the methods include the steps of sequentially exposing a substrate in a growth chamber to a vapor comprising first precursor molecules, purging the growth chamber of the first precursor molecules, exposing the substrate to a vapor comprising second precursor molecules, and purging the growth chamber of the second precursor molecules. During each exposure step, the gaseous precursor molecules react with the substrate surface, or with molecules previously-bound to the substrate surface. During each exposure step, the substrate surface is saturated with precursor molecules which react to completion, disallowing further reactions to continue and resulting in a surface reaction-limited growth mechanism. The cycle of exposure and purge steps can be repeated in order to grow crystalline nanoparticles on the surface of the substrate. Moreover, if the crystalline nanoparticles are made from a material that is capable of undergoing anisotropic growth, the exposure-purge cycles can be repeated until nanorods of a desired length have been grown from the nanoparticles. This process is carried out at higher temperatures and with significantly longer pulsing and purging times than conventional ALD, which typically employs temperatures of no greater than 250° C. and uses pulsing times of less than one second and purging times of no more than a few seconds.

Without intending to be bound to any particular theory, the inventors believe the formation of nanorod morphology using elevated temperatures and extended pulsing and/or purging durations may be the result of the self-combination and absorption of molecules and surface reaction of precursors along different crystal planes, which offers a surface-reaction-limited process analogous to both ALD and pulsed CVD. Thus, the present growth methods can provide an effective decoupling of the nanorod growth from the precursor vapor concentration as does regular ALD. The examples below illustrate self-combination and surface reaction processes that lead to the formation of $TiO_2$ nanorods via an anisotropic growth mechanism.

Figure 1:
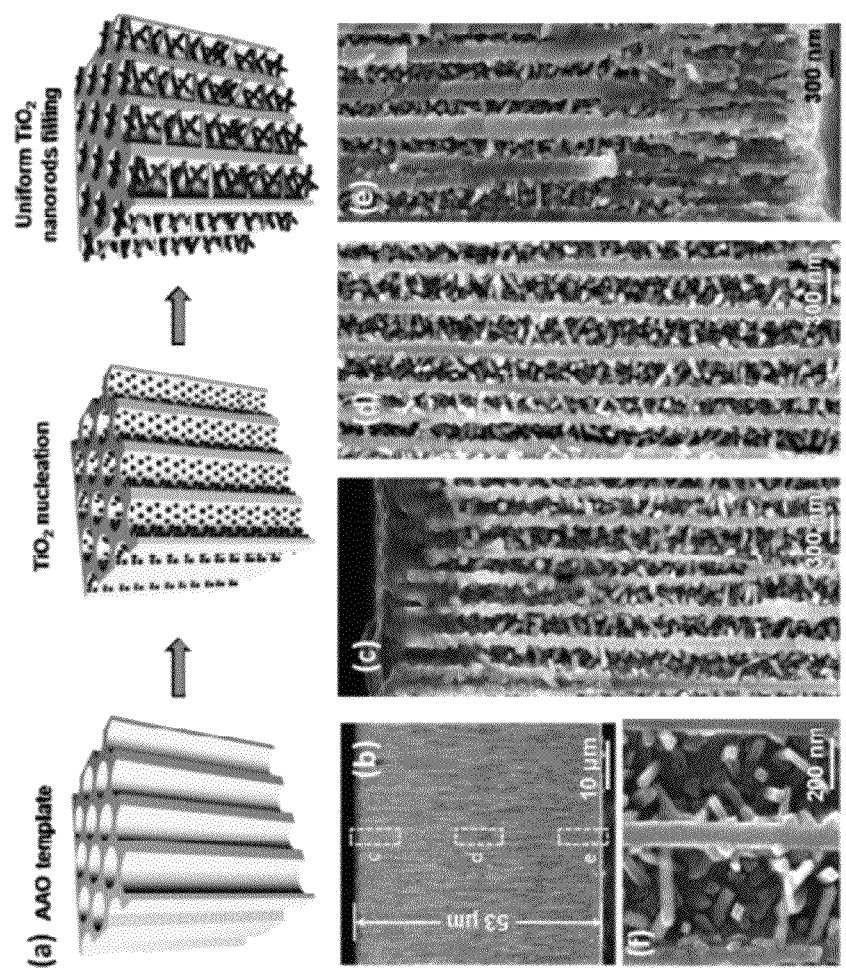
FIG. 1. $TiO_2$ NRs grown in nano-channels. (a) Schematic presentation of growth inside an AAO template, where $TiO_2$ NRs can be uniformly grown along the entire inner channel walls. (b) Overview of a cross section of the AAO template after 660 growth cycles. (c-e) Higher-magnification SEM images showing the uniform and dense coating of $TiO_2$ NRs within the AAO channels at the top, middle, and bottom sections, respectively, as indicated by the dashed boxes in (b). (f) $TiO_2$ NRs rooted on the walls of AAO channels showing a square-like cross section and well-faceted shape.

FIG. 1a schematically illustrates the growth of nanorods in a confined space in accordance with the present methods.

Starting from a growth template that defines one or more three-dimensional growth spaces, such as elongated channels (first panel), this method can produce crystalline nanoparticles (nanocrystallites) grown uniformly over the entire inner surface of the channels (second panel). Under appropriate conditions, these nanoparticles (NPs) continuously grow into nanorods, which protrude radially inward (third panel) within the channels.

One advantage offered by the present methods is that, unlike other growth methods that rely on the precipitation of vapor-phase precursors, the crystal growth rate and precursor concentration are not coupled. As a result, the present methods are able to grow nanorods with uniform density, width, and/or length distributions even within highly confined growth spaces. In contrast, limitations on the diffusion of precursor molecules in highly confined growth spaces results in non-uniform nanorod densities, widths, and/or lengths when nanorods are grown using methods in which the growth rate and precursor concentrations are coupled. For example, when nanorods are grown from nanowires in close proximity (e.g., in a system where the length of the nanorods is on the order of the inter-nanowire spacing) using a vapor-liquid-solid growth process, the nanorods grown from the nanowires tend to be more sparse and shorter toward the bases of the nanowires. This is not the case with the present methods, which are able to grow nanorods having a density, width, and/or length distribution that does not vary significantly as a function of nanorod position along the length of the growth space. Such growth is referred to herein as "uniform".

Because the present methods are adapted to grow dense networks of nanorods, even in confined spaces, they are able to provide structures having high surface areas, as measured by their high roughness factors. In some embodiments, the structures made with the present methods have a roughness factor of at least 2000. This includes structures having a roughness factor of at least 2500 and further includes structures having a roughness factor of at least 3000.

The temperatures, pulsing durations, and purging durations used for the present methods can vary, depending upon such factors as the nature of the precursor molecules and the growth characteristics of the nanorods. In some embodiments, the temperature used to carry out the growth reactions (i.e., the substrate temperature) in the present methods is at least about 400° C. This includes embodiments in which the temperature is at least 450° C., further includes embodiments in which the temperature is at least 500° C., and still further includes embodiments in which the temperature is at least 600° C. In some embodiments of the present methods, the duration of the pulsing (i.e., exposure) period is at least 1 second. This includes embodiments in which the duration of the pulsing period is at least 1.5 seconds. In some embodiments of the present methods, the duration of the purging period is at least 20 seconds. This includes embodiments in which the duration of the purging period is at least 30 seconds, further includes embodiments in which the duration of the purging period is at least 40 seconds and still further includes embodiments in which the duration of the purging period is at least 60 seconds.

The present methods can be used to form crystalline nanoparticles and nanorods from a variety of materials on a variety of substrates. (For purposes of clarity, throughout this disclosure the term nanoparticle will be used to refer to a nanostructure having an aspect ratio of less than 1.2. Although nanoparticles may be spherically or substantially spherically shaped, other geometries are possible. The terms nanorod and nanowire will be used to refer to more elongated nanostructures having an aspect ratio equal to or greater than 1.2 (e.g. $\geq 2$, $\geq 10$, and $\geq 100$). Nanoparticles and nanorods are both characterized by average diameters of no greater than about 100 nm.) For example, the methods can be used to grow metal oxide nanoparticles and nanorods on a metal oxide or semiconductor substrate. The methods are particularly well-suited for the growth of nanorods from compounds that are capable of undergoing anisotropic growth due to a non-central symmetric crystal structure. Non-limiting examples of such compounds include $TiO_2$ and compounds having the same crystal structure as $TiO_2$. Other suitable metal oxides from which the nanoparticles and nanorods can be formed include, but are not limited to, $SnO_2$, $ZnO$, $V_2O_5$, $ZrO_2$, and $CO_3O_4$.

The surfaces of the substrates from which the nanorods are grown can be simple flat surfaces, or can be more complex contoured surfaces that define one or more three-dimensional growth spaces into which the nanorods grow. For the purposes of this disclosure, a three-dimensional growth space is a space defined by a surface having three-dimensional contours, wherein the contours have dimensions greater than the diameters of the nanorods.

Examples of three-dimensional growth spaces include elongated channels, such as those formed in anodized aluminum oxide (AAO) membranes. In such growth spaces, nanorods may be grown radially into the channels from the channel walls. Other examples of three-dimensional growth spaces include the space between and around the nanoscale structures in a matrix formed from the structures (i.e., the inter-structure volume). In such growth spaces, nanorods may be grown outwardly from the nanoscale structures of the matrix and into the inter-structure volume. For example, a matrix comprising a plurality of aligned nanoscale pillars, such as nanowires, can provide a substrate defining a three-dimensional growth space corresponding to the volume around and between the pillars. Similarly, a matrix comprising a plurality of nanoscale particles can provide a substrate defining three-dimensional growth spaces corresponding to the volume between the particles.

In some embodiments, the three-dimensional growth spaces have at least one (e.g., one, two, or three) nanoscale dimension. For the purposes of this disclosure nanoscale means having a size of no greater than 1000 nm. In some embodiments, the three-dimensional spaces have at least one dimension that is no greater than 500 nm. This includes embodiments in which the three-dimensional spaces have at least one dimension that is no greater than about 200 nm and further includes embodiments in which the three-dimensional spaces have at least one dimension that is no greater than about 100 nm. For example, a growth space in the form of an elongated channel can have an average channel diameter that is no greater than 1000 nm. Or, a growth space formed by the volume around and between the nanowires in a matrix of aligned nanowires can have an average inter-nanowire spacing that is no greater than 1000 nm.

The width of the nanorods grown from a substrate will depend on the number of exposure/purge growth cycles used. Typical average nanorod widths are in the range of about 5 to 50 nm. This includes nanorods having an average width in the range of about 10 to 40 nm. Like nanorod width, nanorod length will depend on the number of exposure/purge growth cycles used. Therefore, the nanorod lengths may vary over a wide range. For example, in some embodiments the nanorods may have an average length of 50 nm to about 500 nm. This includes nanorods having average lengths of about 100 to 300 nm. In some embodiments the lengths of the nanorods are sufficiently long that at least some of the nanorods are able to bridge the three-dimensional growth space into which they are grown. For example, if the growth space is an elongated channel with a nanoscale diameter, the nanorods can be sufficiently long to extend across the diameter of the channel. Alternatively, if the growth space is defined by a matrix of nanoscale structures, the nanorods can be sufficiently long to extend from one nanoscale structure to another in the matrix.

In some embodiments, the methods can be used to form a continuous (i.e., unbroken) coating of nanorods that covers at least a portion (e.g., over 50%, over 70%, or over 90%) of the substrate surface.

In some embodiments the density of nanorods on the substrate surface or within the growth spaces is sufficiently high that they merge into an "interlinked" nanorod structure. For example, nanorods grown from a substrate surface may merge at their roots to create an interlinked structure. Alternatively, nanorods grown into a confined growth space may merge or intertwine along their lengths to create an interlinked structure. In such embodiments, the interlinking may be extensive enough that the nanorods form a structure capable of maintaining its structural integrity even if the substrate is selectively removed. Such structures are referred to as free-standing, nanorod networks. Once the substrate is selectively removed, the free-standing, nanorod networks define one or more cavities corresponding in shape to the original substrate from which the nanorods were grown.

The follow examples illustrate the use of the present methods to form 3D nanorod networks. Although the methods are exemplified by the growth of 3D $TiO_2$ nanorod networks, they can also be used to form nanostructures from a variety of other functional materials.

EXAMPLES

Example 1

Titanium Dioxide Nanorods Grown from an AAO Substrate

Growth of $TiO_2$ nanorods was performed in a home-made ALD system at 600° C. using $TiCl_4$ and $H_2O$ as precursors and an anodic aluminum oxide (AAO) membrane as a deposition substrate. The AAO substrate was supported by a hemi-cylindrical quartz boat (thus 5 mm open space was left under the back side of the AAO) and placed at the center of the stainless steel tube chamber, 10 cm downstream from the precursor gas inlet. During the growth, a constant flow of 40 sccm nitrogen ($N_2$) was applied into the chamber as the carrier gas. With the flow of nitrogen gas, the total pressure was 300 mTorr (40 Pa). The chamber temperature was maintained at 600° C. $TiCl_4$ and $H_2O$ vapor precursors were pulsed sequentially into the chamber for 1.5 s each with each pulse being separated by $N_2$ purging for 60 s. One complete growth cycle included 1.5 s of $H_2O$ pulse +60 s of $N_2$ purging +1.5 of $TiCl_4$ pulsing +60 s of $N_2$ purging. After growth, the chamber cooled down to room temperature naturally (typically taking several hours) with $N_2$ flow.

Figure 7:
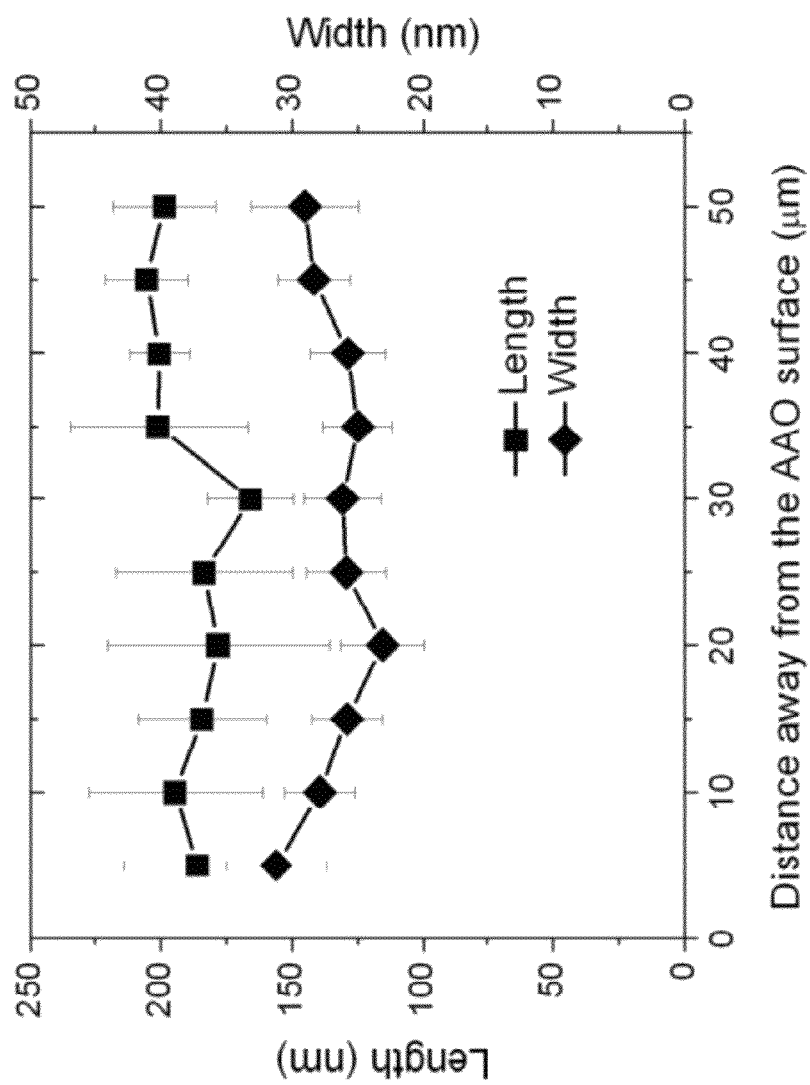
FIG. 7. Length and width distribution of $TiO_2$ nanorods along an AAO channel. The data were collected from the $TiO_2$ nanorods grown using 660 growth cycles.

The AAO templates used as nanorod growth templates in these experiments were ~53-54 μm thick with average channel diameters of ~250 nm, which yields an aspect ratio of ~200. FIG. 1b shows the cross section of the AAO template after 660 cycles. SEM images acquired from the top, middle and bottom section are shown in FIGS. 1c, d, and e, respectively, revealing the uniform and dense coverage of $TiO_2$ NRs along the entire channel length except the 1-2 μm entrance regions. Closer examination shows that all NRs were rooted on the walls of the AAO channels and pointed inward (FIG. 1f). Most NRs exhibit a rectangular cross section with a few tens of nanometers in width and a few hundreds of nanometers in length. The length and width distributions were statistically analyzed along the channels (FIG. 7). The majority of the as-synthesized $TiO_2$ NRs had lengths of between 170-210 nm and widths of between 25-30 nm respectively. Good uniformity of the NRs along the entire channel length indicates an effective decoupling of the crystal growth from the precursor partial pressure. The anatase phase of the $TiO_2$ NRs was initially identified by X-ray diffraction (XRD) and the composition was confirmed by energy-dispersive X-ray spectroscopy (EDS).

Figure 2:
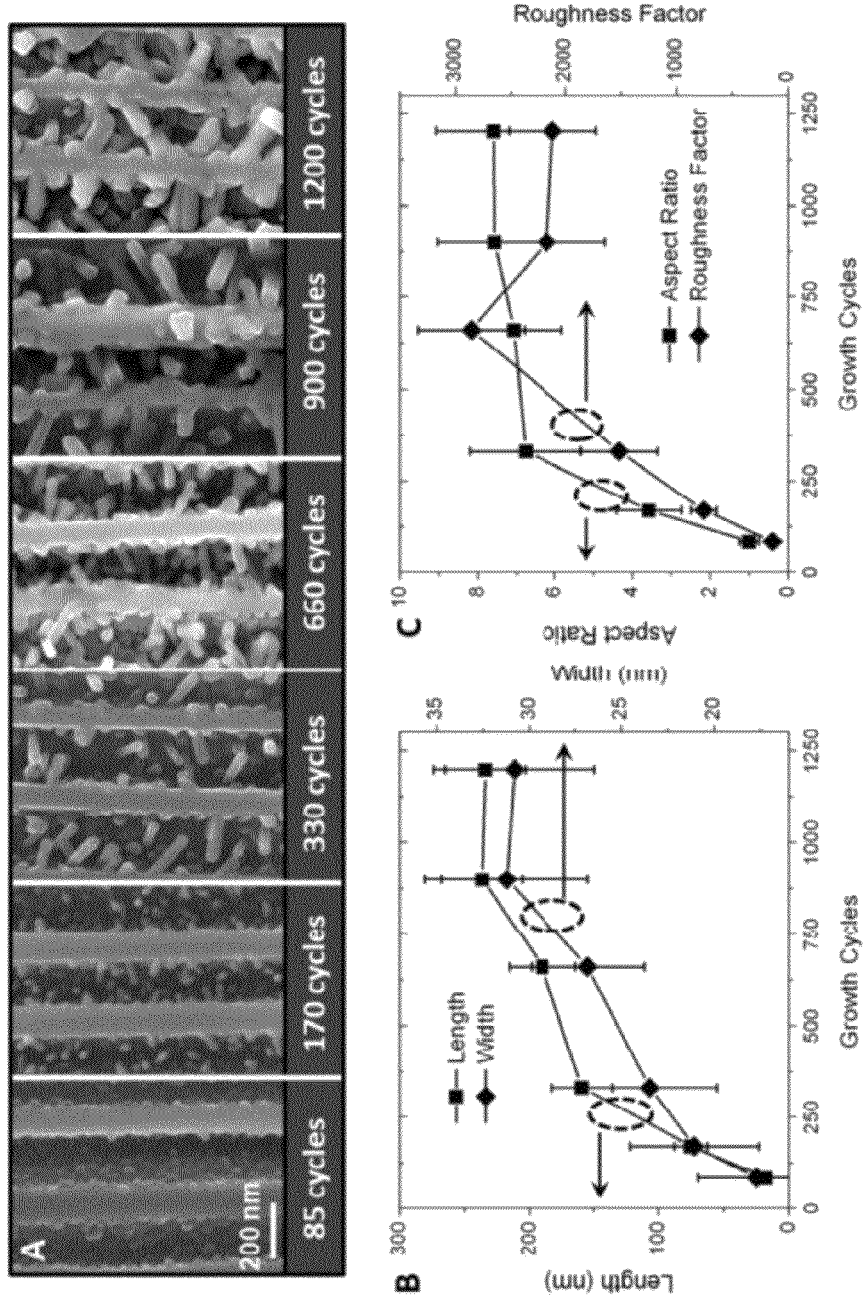
FIG. 2. Growth rate and evolution of $TiO_2$ NR structures. (a) SEM images of typical NR morphology after increasing numbers of growth cycles. From left to right are shown the images for 85, 170, 330, 660, 900, and 1200 growth cycle. (b) Plots of NR length (square symbols) and thickness (diamond symbols) versus growth cycles. The data were collected from several hundred NR samples. (c) Plots of the aspect ratio of the NRs (square symbols) and roughness factor (diamond symbols) versus the number of growth cycles. The highest aspect ratio was ~7 for 900 growth cycles. The maximum value of the roughness factor reached ~3000 for 660 growth cycles.

To investigate the growth behavior of $TiO_2$ NRs inside the AAO channels, growth cycles of 85, 170, 330, 660, 900, and 1200 were used and the evolution of NR morphology was examined by SEM (FIG. 2a). Length and width measurements revealed a faster growth rate in the first several hundred cycles (FIG. 2b). Before the 330-cycle growth point, the average growth rate along the length was ~0.5 nm/cycle, while the growth rate subsequently dropped to ~0.1 nm/cycle. The growth rate along the width direction was ~0.03 nm/cycle. The slower growth rate was possibly the result of the smaller volume left in the AAO channel for precursor transportation when the NRs became larger. The length of the NRs saturated at 230-240 nm which correlated with the average diameter of the AAO channels (~250 nm). The aspect ratio of the NRs followed a parabola-like curve, increasing from 1 (at 85 cycles) to a maximum of 7 (at 900 cycles) (FIG. 2c). The slight decrease of aspect ratio after 900 cycles was a consequence of the saturation of NR length.

Figure 8:
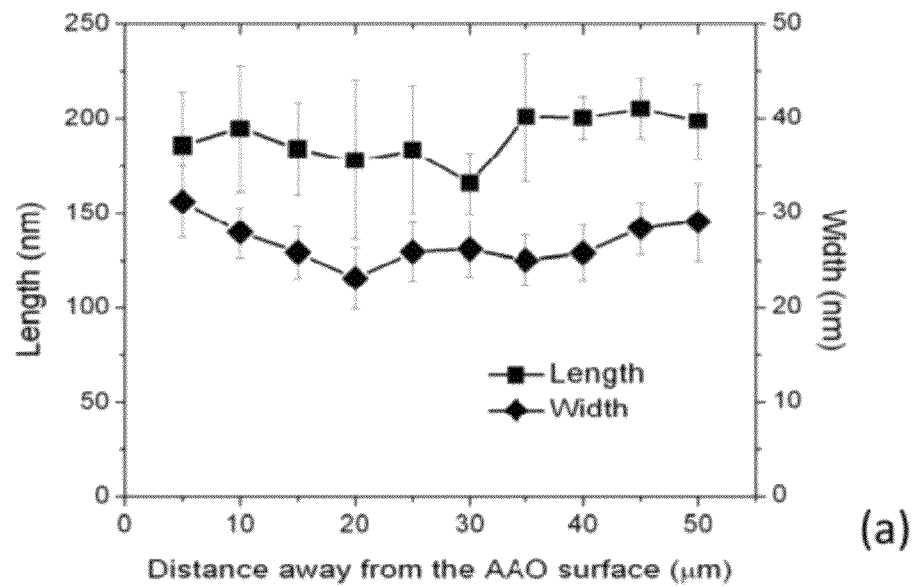
FIG. 8. (a) Length and (b) width analysis of the $TiO_2$ nanorods grown using different numbers of growth cycles. Both length and width exhibit a uniform distribution along the entire AAO channel and are not dependent on the lateral positions within the channels.
Figure 8:
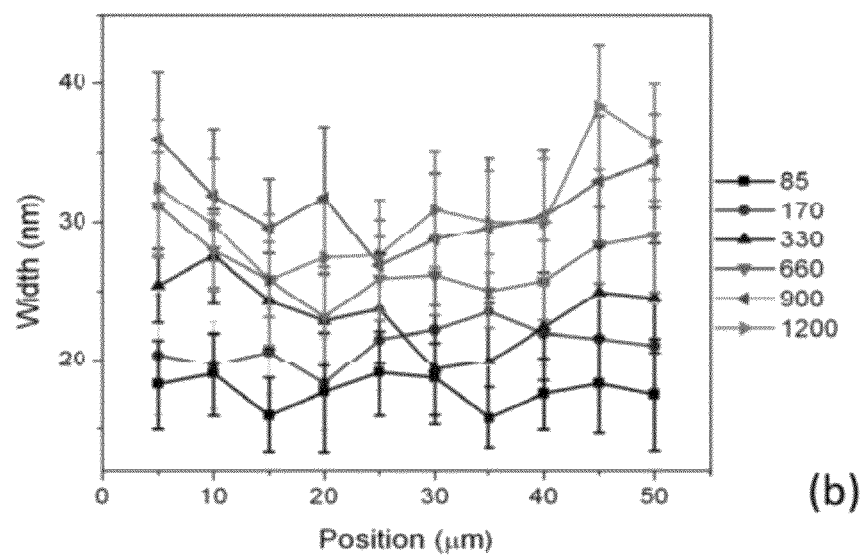

Further statistical study revealed a uniform NR geometry distribution inside the AAO channels (FIG. 8). This growth behavior is the distinguishing feature of the ALD process but differs from other synthesis approaches. The growth rate of the NR width was ~0.3-0.4 Å/cycle (~0.15-0.2 Å/cycle on each side), which was about a quarter of the typical amorphous $TiO_2$ film ALD deposition rate (0.8 Å/cycle). This rate is within the growth rate range at the initial ALD stage, where the surface absorption sites are less. On the other hand, the growth rate along the NR length direction was ~5 Å/cycle, which was more than 6 times higher than the typical ALD film growth rate. Such an anisotropic growth behavior is very different from that of ALD.

The NR 3D architectures produced by the present methods offer a very high surface area. The roughness factor, which is defined as the total NR surface area per unit substrate area, reached ~3000 (cal.) at 660 cycles. This number is about the same as the roughness factor of highly-packed NP networks and nearly ten times higher than pure NW arrays with the same vertical length. The high roughness factor indicates that the present methods can produce a novel and high-performance 3D electrode architecture for photovoltaic or catalytic cells, when the $TiO_2$ NRs are grown inside a conductive nano-skeleton.

A series of controlled experiments were performed to better understand the NR growth. The observation that only NP growth morphology was found on the top surface of the AAO template suggested that nanochannels might be a favorable geometry for anisotropic growth. In addition, TEM analysis showed that those NPs were constructed by the {011} surfaces, which were later found to have different exposed facets than $TiO_2$ NRs. Through the same process (660 cycles, 1.5 pulse time and 60 s purge time), NPs were found to be the dominant morphology on the surface of a polycrystalline $Al_2O_3$ substrate, an exposed AAO channel surface, and a Si substrate (FIG. 3a-i). The low precursor partial pressure inside the confined AAO channels might be a reason for formation of the NR structures. In order to test this hypothesis, a reduced pulsing time (200 ms) was applied to grow TiO$_2$ on a flat silicon substrate. From the pressure gauge readouts, the 200 ms pulsing time could reduce the precursor partial pressure by ~75% compared to the 1.5 s pulsing time. After 330 cycles, scattered NR morphology was observed (FIG. 3a-ii), which indicates that the partial pressure is one of the parameters that control the formation of NR morphology. However, these NRs were smaller than those collected inside AAO channels. Therefore, it is reasonable to conclude that the longer dwelling time of precursor molecules inside AAO channels may lead to the larger size of the NRs. In addition to reducing the precursor partial pressure to a proper level, favoring NR growth, the AAO channels may also act as a reservoir for continuously supplying precursors for a longer time.

Figure 3:
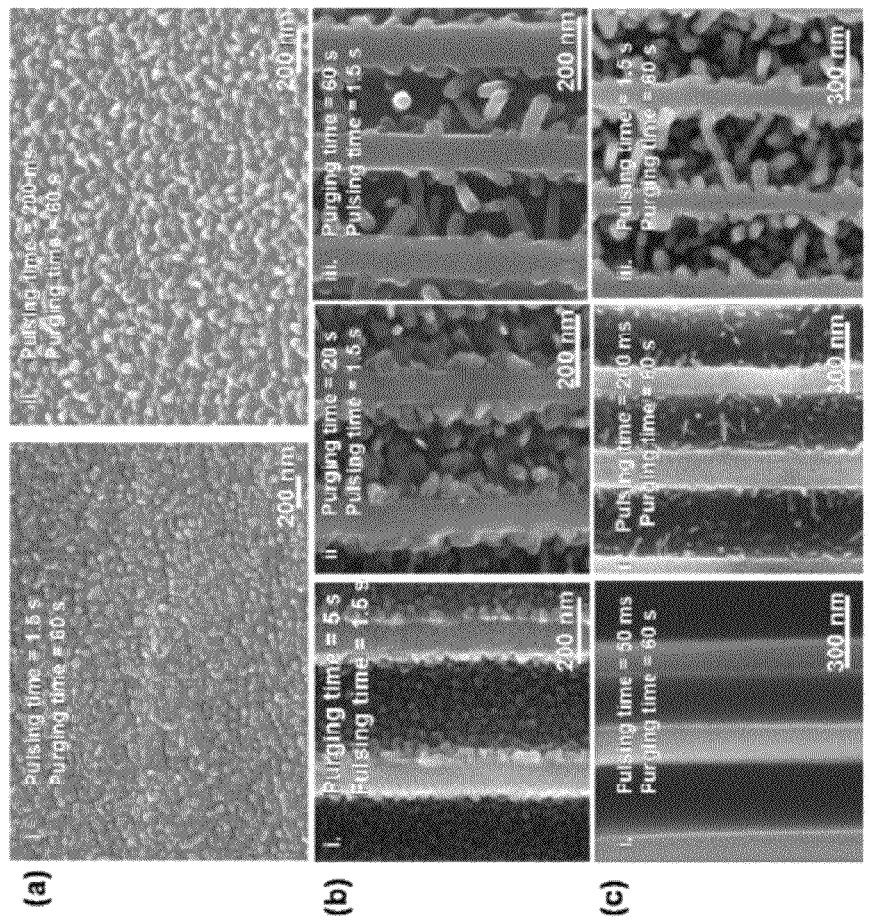
FIG. 3. Anatase $TiO_2$ nanostructures deposited under controlled experimental conditions, as described in the examples below, for the growth of nanostructures. (a) Exposure time effect on a flat silicon substrate using 330 growth cycles at 600° C. and a 60 s purging time. i: NPs were grown with a regular pulsing time (1.5 s); ii: NR morphology started to develop with a reduced pulsing time (200 ms). (b) Purging time effect on $TiO_2$ morphology using 330 growth cycles at 600° C. and a 1.5 s pulsing time. i: NPs were grown with a 5 s purging time; ii: A majority of the grown nanostructures were NPs when a 20 s purging time was used but sparse, small NRs were also observed; iii: NR morphology dominated the growth when a 60 purging time was used. (c) Pulsing time effect on $TiO_2$ morphology using 330 growth cycles at 600° C. and a 60 s purging time. i: no deposition was observed with a 50 ms pulsing time; ii: low density and tiny $TiO_2$ NRs were observed with a 200 ms pulsing time; iii: regular size $TiO_2$ NRs were grown with a 1.5 s pulsing time.

A series of experiments were conducted to test the effect of purging time on nanorod growth, as shown in FIG. 3b. The shorter purging times (5 s and 20 s at 330 cycles) resulted in the formation of NPs inside the AAO channels, although sparse, small NRs could be found in the 20 s sample (FIG. 3b-ii). NR morphology appeared when the purging time increased to 1 min (FIG. 3b-iii). These observations suggest that a short purging time might not be sufficient to complete an anisotropic surface reaction or to demonstrate the different growth behaviors of different crystal surfaces. Thus, longer purging times may be necessary to preferentially remove physically absorbed precursor molecules from certain crystal surfaces, thereby facilitating the anisotropic growth.

The effect of pulsing time on NR growth was also studied inside the AAO channels (FIG. 3c), where 50 ms, 200 ms and 1.5 s pulsing times were used to grow TiO$_2$ NRs with a 60 s purging time and 660 growth cycles. The 200 ms pulsing time resulted in much smaller (~10 nm in width and ~50 nm in length) and less dense NRs than those produced using the 1.5 s pulsing time. No deposition was obtained when the pulsing time was reduced to 50 ms. Considering that an ALD TiO$_2$ film could be fabricated at 80° C. with a 50 ms pulsing time and 60 s purging time in this system, the absence of deposition at 600° C. indicates that a nucleation event may not be able to occur when the precursor partial pressure is too low. The low density of tiny TiO$_2$ NRs grown in AAO channels with a pulsing time of 200 ms implies that low partial pressure would lead to a small number of nucleation events.

Figure 4:
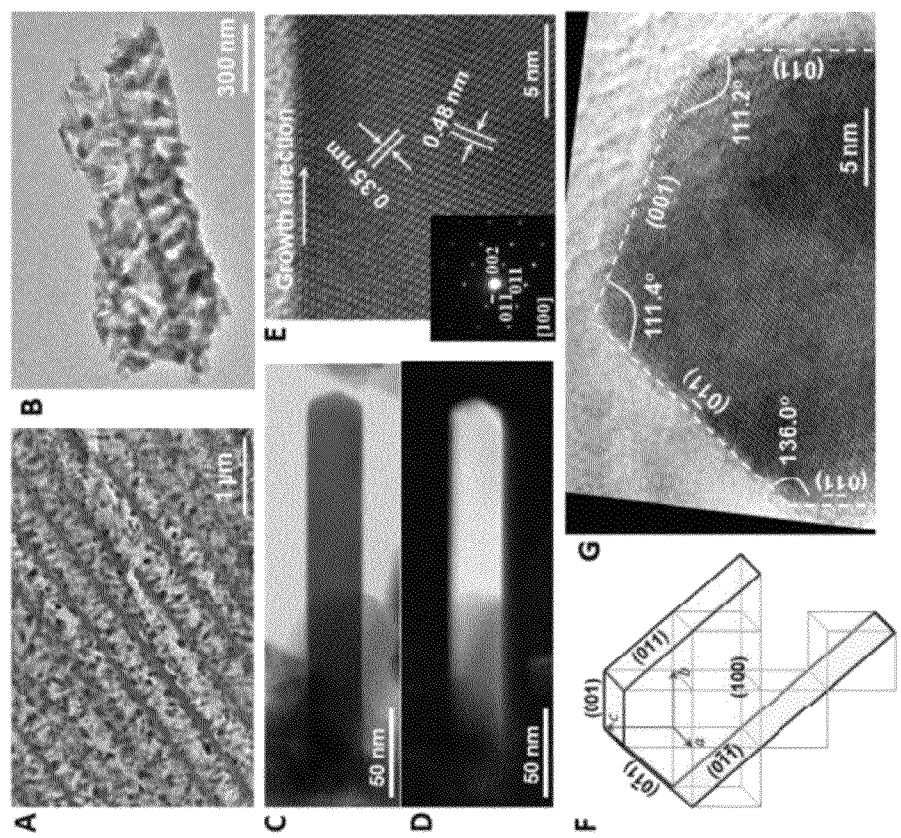
FIG. 4. Structure and morphology characterizations of $TiO_2$ NRs. (a) TEM image of a cross section of AAO channels filled with $TiO_2$ NRs grown using 660 cycles. (b) $TiO_2$ NRs bundles after dissolving the AAO template completely, after 1200 growth cycles. (c, d) Bright field and dark field TEM images of a single-crystalline $TiO_2$ NR demonstrating high thickness/width uniformity and excellent crystal integrity. (e) High-resolution TEM image of an anatase $TiO_2$ NR. The measured lattice spacing of the (011) and (002) planes are 0.35 nm and 0.48 nm, respectively. The inset is the corresponding selective-area diffraction (SAED) pattern. (f) Proposed $TiO_2$ NR structure shaped by three groups of atomic planes: {100}, {011}, and {001}. A unit cell is represented by a cube with a, b and c parallel to the [100], [010], and [001] directions, respectively. (g) HRTEM image of a typical NW tip faceted by the (001), (011), (0$\bar{1}\bar{1}$), and (0$\bar{1}$1) planes. The asymmetric tip geometry is the result of different crystal surface areas and different inter-planar angles.

The TiO$_2$ NRs morphology was further characterized by transmission electron microscopy (TEM). FIG. 4a shows a cross-section of the AAO channels crisscrossed with TiO$_2$ NRs. The compact NR arrays were found evenly distributed inside the AAO channel. In order to investigate the adhesion between neighboring NRs, the AAO templates were removed by immersing the samples in a mild phosphoric acid solution for 5 hours at 80° C. Below 660 cycles, most tubular NRs assemblages fell apart after template removal, indicating isolated growth sites of the NRs. However, if the growth was increased from 660 to 1200 cycles, tubular assemblages were observed post AAO template removal (FIG. 4b). This observation showed that the additional crystal growth was sufficient to physically interlink the NR roots to provide a free-standing structure.

A typical TiO$_2$ NR morphology (grown >300 cycles) is shown in FIG. 4c, where the NRs exhibited a highly uniform thickness, well-faceted surfaces, and an aspect ratio of ~7. Uniform contrast was observed on the corresponding dark field image (FIG. 4d), indicating the high lattice quality and a dislocation-free structure. Selected area electron diffraction (SAED) taken on the NRs further confirmed the anatase structure (Inset of FIG. 4e) with the {011} as side surfaces and the {100} as the surfaces in-plane of the image. Combination of the [002] and [0$\bar{1}$1] directions was identified as the NR growth direction. High-resolution TEM (HRTEM) clearly revealed the arrangement of the (002) and [0$\bar{1}$1] planes along the NR growth direction with a lattice spacing of 0.48 and 0.35 nm, respectively (FIG. 4e). Such a lattice orientation represented all anatase NRs characterized by TEM. Based on the SEM, SAED, and TEM observations, the structure of an anatase NR is illustrated in FIG. 4f. The four side planes of a NR are (011), (0$\bar{1}\bar{1}$), (100) and ($\bar{1}$00). They are perpendicular to each other and form a rectangular cross section. The top surface of the NR is composed of the (001) and (0$\bar{1}$1) planes. From the HRTEM image of a NR tip (FIG. 4g), the angle of the tip was observed to be 111.4°, which is consistent with the angle between the (001) and (0$\bar{1}$1) planes. These two planes often exhibited different surface areas, resulting in an asymmetrical NR tip. Such a growth orientation is different from the anatase TiO$_2$ NWs synthesized by hydrothermal or vapor deposition processes, where the growth direction is along the <011> or the <001> and the commonly-observed facets of anatase TiO$_2$ are {011} or {101} due to their low surface free energy as predicted by theoretical calculations.

Further HRTEM characterization revealed that all the TiO$_2$ NRs exhibited atomically flat {011} surfaces (FIG. 4g), while the (001) plane was marked by islands and multiple atomic steps (FIG. 4g). Such unevenness of the NR tip could also be observed along the [100] direction. At the early growth stage (330 cycles or less), TiO$_2$ NRs often exhibited a non-faceted or irregular tip, but the atomically flat side-surfaces could already be clearly observed (FIG. 4e). These observations suggest that the (001) plane was a particularly active deposition and growth surface. In a rare case, planar defects were observed along the (001) surface, which would also be the result of fast stacking of the (001) planes. However, the observed growth was along a high-index orientation which was close to the [0$\bar{1}$5] direction. This disparity may be a result of the nonorthogonality of the fast growing (001) plane with respect to the slower growing {011} and {100} side planes.

Figure 5:
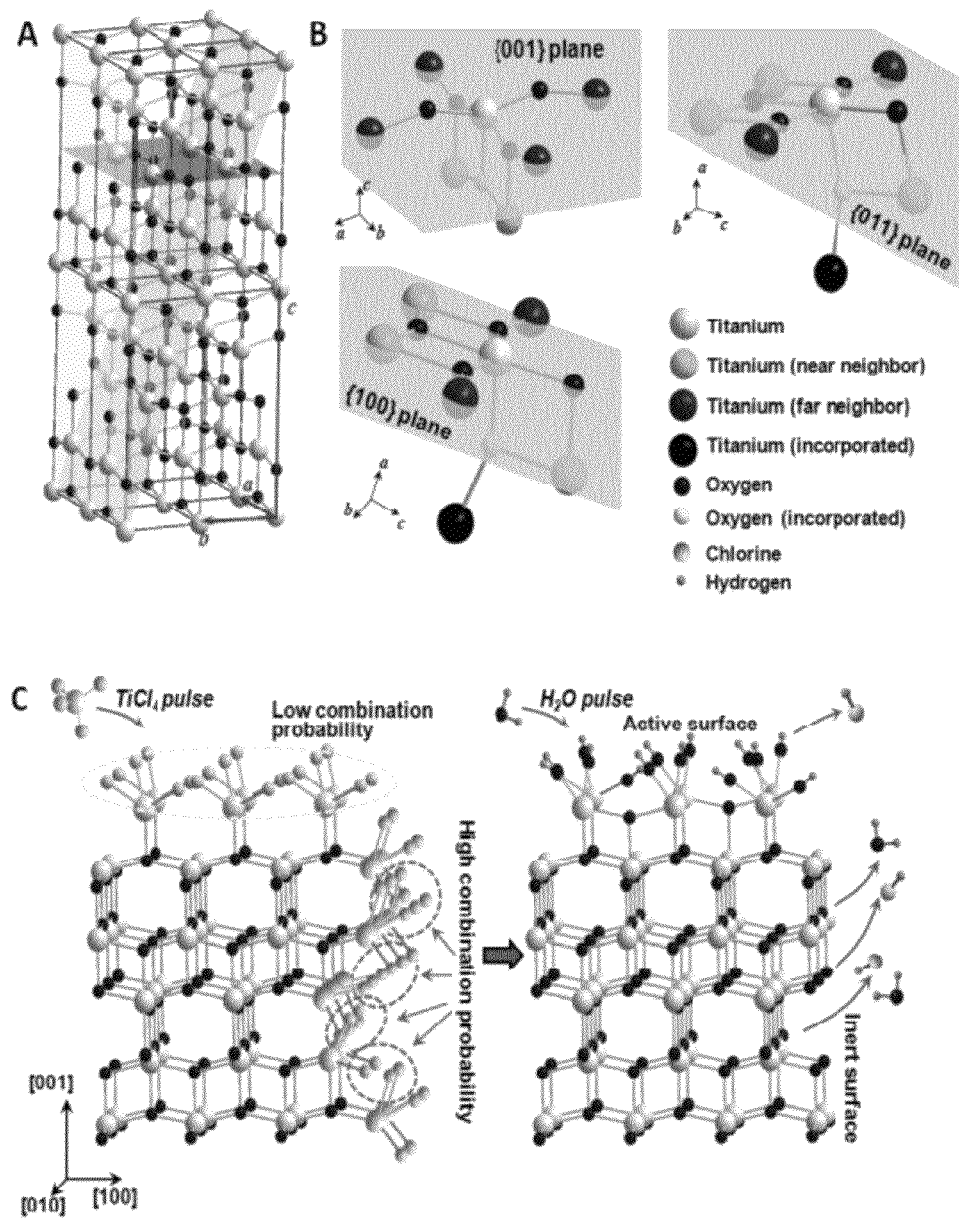
FIG. 5. Understanding the $TiO_2$ NR growth mechanism. (a) Crystal structure model of a 2×2×2 supercell of anatase $TiO_2$, where the (001), (011), and (100) planes are highlighted as the horizontal, diagonal, and vertical planes, respectively. (b) Ball-and-stick model of the {001}, {011}, and {100} cleavage surfaces centered with a randomly selected Ti atom (central white). Large grey and large black Ti atoms represent the near and far neighbors, respectively, corresponding to the center Ti atom. Incorporated Ti (large black, outside the shaded regions) is inside the lattice and chemically inert. The {001} surface has 3 far and 1 near neighboring Ti atoms; while the {011} and {100} surfaces have 1 far and 3 near neighboring Ti atoms. (c) Schematic illustration of one ideal growth cycle. The left-hand-side shows the (001) and (100) planes after a $TiCl_4$ pulse. For clear presentation, it is assumed that all the surface Ti atoms on the (001) and (100) planes are newly added during the $TiCl_4$ pulse. Thus, each of them has three Cl atoms attached. The right-hand-side shows the situation following a water pulse. The (100) surface becomes inert due to the near-neighbor self-combination; while the (001) surface remains active with the Cl replaced by —OH groups. The {011} planes (not shown) would have the same property as the {100} planes.

Beginning with the observation that the (001) surface was the dominant growth front for the surface-dictated growth mechanism, the (001) plane was analyzed and compared with the {011} and {100} planes. A surface self-combination mechanism can be proposed to explain the anisotropic growth behavior. Such an explanation is presented in conjunction with FIG. 5. However, the present invention is not limited to those systems and methods that fit within this explanation or any theory of operation presented herein. FIG. 5a shows the crystal structure of anatase TiO$_2$ represented by a 2×2×2 supercell, where the {001}, {011} and {100} facets are highlighted by the horizontal, diagonal and vertical planes, respectively. Cleavage surfaces along these planes are shown in FIG. 5b. Each plane includes one randomly selected Ti atom (colored with white) and all of its neighboring Ti atoms which can bond with the selected Ti through an intermediate O atom (small black). Three types of neighboring Ti atoms can be classified:

(1) Incorporated Ti atom (black). This Ti atom lies inside the crystal lattice and is chemically inert. It is considered as the atom that previously provided the chemical bonding site to a TiCl$_4$ molecule and captured it onto the surface.
(2) Far-neighbor (large black). A Ti atom that is 3.78 Å away from the center Ti atom.
(3) Near-neighbor (large grey): A Ti atom that is 3.04 Å away from the center Ti atom.

The numbers of Ti neighbors on different atomic planes, and their relationships to one another, are summarized in Table 1.

TABLE 1

The number of far-neighbor or near-neighbor Ti atoms with respect to a randomly selected center Ti atom. The number is counted based on oxygen sharing. If one neighbor shares one oxygen exclusively with the selected Ti atom, it is counted as 1; if two neighbors share one oxygen together with the selected Ti atom, each is counted as ½

| Atomic plane | Number of far neighbors | Number of near neighbors |
| --- | --- | --- |
| {001} | ½ × 2 + 1 × 2 = 3 | ½ × 2 = 1 |
| {100} | ½ × 2 = 1 | 1 + ½ × 4 = 3 |
| {011} | ½ × 2 = 1 | 1 + ½ × 4 = 3 |

In a typical growth cycle, when a TiCl$_4$ molecule arrives on a growth front from vapor, it incorporates into the TiO$_2$ lattice through the chemical reaction with one surface —OH group, as shown in Eq. 1.

$$TiCl_4(surf.g) + \text{—}OH(surf.g) = \text{—}O\text{—}TiCl_3(surf.) + HCl(g) \quad (1)$$

The Cl on the —TiCl$_3$ group are active atoms that will react with H$_2$O in the following precursor pulse, as shown in Eq. 2.

$$\text{—}O\text{—}TiCl_3(surf.) + xH_2O(surf.g) = \text{—}O\text{—}Ti\text{—}(OH)\text{—}Cl_{3-x}(surf.) + xHCl(g) \, (x=1, 2, 3) \quad (2)$$

The —OH groups are active groups that can react either of two ways: with other surface active atoms (self-combination—a termination process, as shown in Eqs. 3 and 4) or with the precursor molecules in the next cycle (absorption of new atoms—the growth process, as shown in Eq. 1).

$$Ti\text{—}OH(surf.) + Ti\text{—}OH(surf.) = Ti\text{—}O\text{—}Ti(surf.) + H_2O(g) \quad (3)$$

$$Ti\text{—}OH(surf.) + Ti\text{—}Cl(surf.) = Ti\text{—}O\text{—}Ti(surf.) + HCl(g) \quad (4)$$

If all —OH or —Cl groups on a Ti atom are replaced by the —O—Ti— bonds, this Ti atom is regarded as inactive. It can be assumed that the possibility of self-combination between near-neighbors would be significantly higher than that between far-neighbors. Thus, during a long purging time (~60 seconds) at sufficiently high temperature (~600° C.), the system approaches the limit where all near-neighbors have undergone self-combination with one another but some of the far-neighbors still remain active. Based on this rationale, the {100} and {011} surfaces would become an inert surface before the following TiCl$_4$ pulse, because of the existence of 3 near-neighbors, which would consume all active —OH groups by self-combination. But the {001} surfaces would maintain its chemical activity due to the existence of only 1 near-neighbor. FIG. 5c schematically illustrates the growth fronts at the (001) and (100) surfaces in such an ideal case, where the surfaces are covered by —TiCl$_3$ active groups after the TiCl$_4$ pulse. During the H$_2$O pulsing and following purging periods at high temperature, the —Cl atoms will react with H$_2$O. On the (100) surface, the majority of —TiCl$_3$ groups become inactive due to the self-combination among near-neighbors. The (001) surface, however, is dominated by far-neighbors. Thus, the self-combination probability is much lower on this surface, leaving a significant amount of surface —OH groups that are ready for the second growth cycle or for absorbing more nearby molecules within the current cycle.

Therefore, the following process is suggested: the TiO$_2$ NRs were grown by the rapid surface chemical reaction on the active (001) planes but growth-limited to an equal degree on the inert {100} and {011} facets. This mechanism explains the observed growth rate difference along the different crystal planes for NR growth. When the partial pressures of both precursors are sufficiently high, as represented by the condition shown in FIG. 3a-i, the difference of the molecules absorption abilities between the {001} and {011} or {100} might become trivial and NP morphology is formed. When the purging time is not long enough, as reflected by the conditions shown in FIGS. 3b-i and ii, the physically adsorbed precursor molecules might not be effectively removed from the inert {011} and {100} surfaces, and thus NP morphology is more likely to appear. Based on this analysis, the growth process could be regarded as a surface reaction-limited mechanism.

Another possible mechanism is that the {011} and {100} facets would result in a similar reactivity as the un-treated surface on which ALD is performed, where the number of available surface active sites are very limited. This is consistent with the fact that the growth rates along these surfaces were maintained at the same level as that of the initial ALD growth rate. Ideally, the (001) plane would have two available —OH groups on each Ti atom. Therefore, in the following TiCl$_4$ pulse, each Ti on the (001) plane may capture two additional Ti atoms from the precursor (Eq. 4). Since the Ti ratio between each Ti atomic layer is 1, the 2:1 absorption ratio allows there to be sufficient Ti available for the formation of two TiO$_2$ layers during the following H$_2$O pulse and subsequent crystallization process. Growing two TiO$_2$ layers per cycle would generate a half unit cell layer along the [001] direction, which is ~4.75 Å/cycle and matches the observed NR axial growth rate.

Example 2

Titanium Dioxide Nanorods Grown from Si Nanowire Matrices, Si Nanochannels and Silica Sphere Matrices Growth of TiO$_2$ nanorods was performed in a home-made ALD system at 600° C. using TiCl$_4$ and H$_2$O as precursors and Si nanowire matrices, Si nanochannels and silica sphere matrices as substrates. The methods used to fabricate the Si nanowires, nanochannels and spheres are described in E. Garnett, P. Yang, *Nano Lett.*, 10, 1082, 2010. The substrates were supported by a hemi-cylindrical quartz boat and placed at the center of the stainless steel tube chamber, 10 cm downstream from the precursor gas inlet. During the growth, a constant flow of 40 sccm nitrogen (N$_2$) was applied into the chamber as the carrier gas. With the flow of nitrogen gas, the total pressure was 300 mTorr (40 Pa). The chamber temperature was maintained at 600° C. TiCl$_4$ and H$_2$O vapor precursors were pulsed into the chamber for 2.0 s each; and separated by N$_2$ purging for 60 s. One complete growth cycle includes 2.0 s of H$_2$O pulse +60 s of N$_2$ purging +2.0 s of TiCl$_4$ pulsing +60 s of N$_2$ purging. After growth, the chamber cooled down to room temperature naturally (typically taking several hours) with N$_2$ flow.

Figure 6:
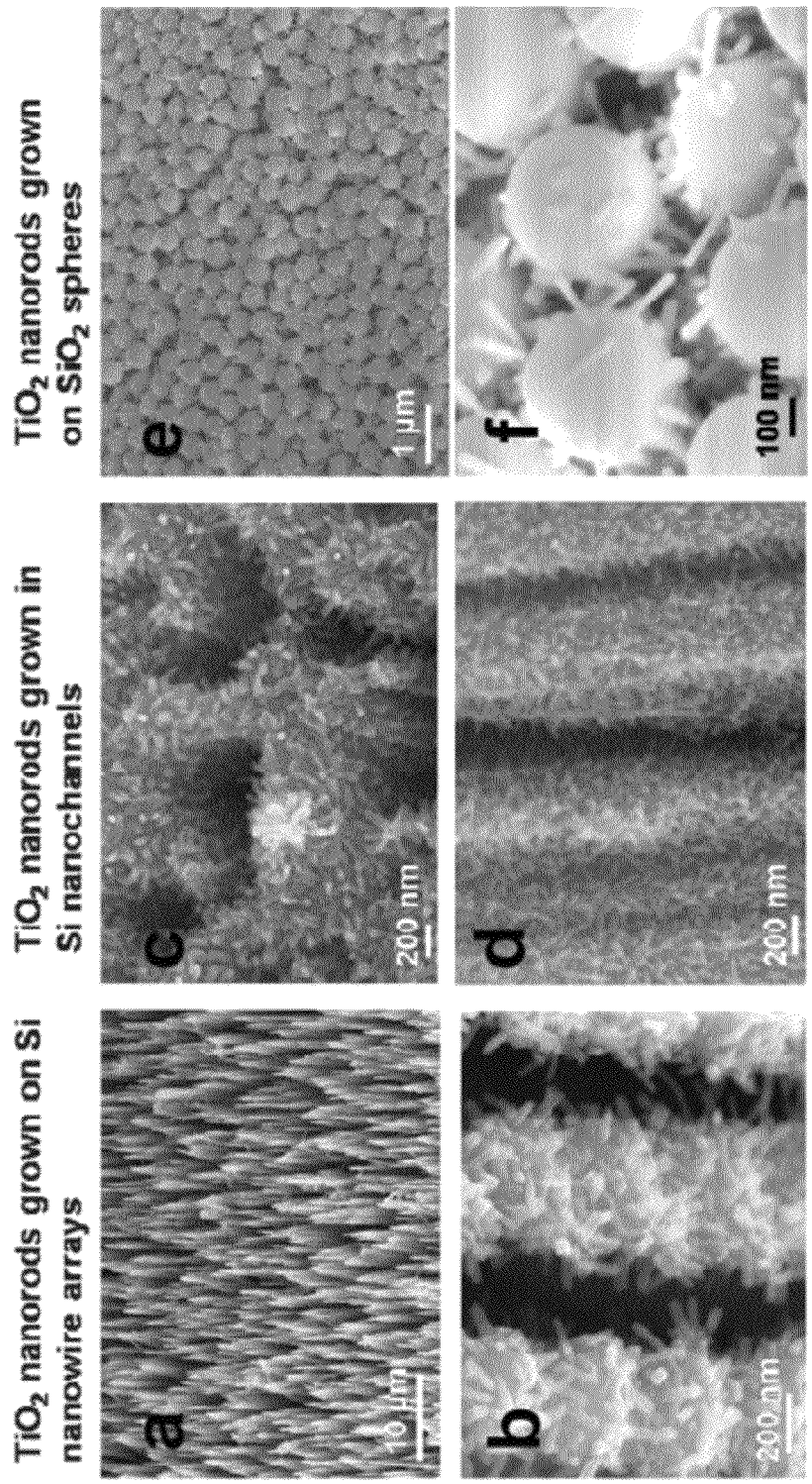
FIG. 6. Growth of NRs on different substrates. (a) and (b) show $TiO_2$ NRs grown on the Si nanowire arrays. Each Si nanowire is 30 μm long and 500 nm wide. (c) and (d) $TiO_2$ nanorods grown in Si nanochannels. $TiO_2$ NRs were densely grown inside the deep region of the nanochannel, which is 200 nm in diameter and 30 μm in length. (e) and (f) $TiO_2$ NRs grown on a silica sphere surface.

FIGS. 6a and 6b show the SEM images of TiO$_2$ NRs grown on the Si nanowires array (i.e., nanowire matrix). Each Si nanowire is 30 μm long and 500 nm wide. The gap between neighboring Si nanowires in the matrix is 200 nm. TiO$_2$ NRs were found uniformly to cover the Si nanowires in the matrix. Each TiO$_2$ NR is ~200 nm in length and ~30 nm in width. TiO$_2$ nanorods were also formed in Si nanochannles as shown in FIG. 6a. FIG. 6d is the SEM image of the cross sectional area of TiO$_2$ NRs densely grown inside the deep region of a nanochannel which is 200 nm in diameter and 30 μm in length. TiO$_2$ NRs were also successfully grown on the silica sphere surfaces in the matrix of spheres, as shown in FIGS. 6e and 6f. Controlling the pulse time could tailor the density of these titania NRs.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A three-dimensional nanorod network comprising:
   (a) a substrate that defines at least one three-dimensional growth space having at least one nanoscale dimension; and
   (b) a plurality of nanorods extending outwardly from the substrate surface and into the at least one three-dimensional growth space, wherein the plurality of nanorods are uniformly distributed on the substrate surface in the at least one growth space, and wherein the nanorods are metal oxide nanorods, and wherein the metal oxide is $TiO_2$.

2. A three-dimensional nanorod network comprising:
   (a) a substrate that defines one or more three-dimensional growth spaces having at least one nanoscale dimension; and
   (b) a plurality of single-crystalline nanorods extending outwardly from the substrate surface and into the three-dimensional growth spaces, wherein the plurality of nanorods are uniformly distributed on the substrate surface in the growth spaces, the nanorod network having a roughness factor of at least 3000.

3. A three-dimensional nanorod network comprising:
   (a) a substrate that defines at least one three-dimensional growth space having at least one nanoscale dimension; and
   (b) a plurality of single-crystalline nanorods extending outwardly from the substrate surface and into the at least one three-dimensional growth space, the nanorods having a solid cross-section along their lengths, wherein the plurality of nanorods are uniformly distributed on the substrate surface in the at least one growth space, further wherein the substrate defines a plurality of three-dimensional growth spaces comprising elongated channels having nanoscale diameters and the nanorods extend inwardly from the walls of the elongated channels, and further wherein at least some of the nanorods are merged at their roots.

4. The nanorod network of claim 3, wherein the substrate is an anodized aluminum oxide membrane.

5. A three-dimensional nanorod network comprising:
   (a) a substrate that defines at least one three-dimensional growth space having at least one nanoscale dimension; and
   (b) a plurality of single-crystalline nanorods extending outwardly from the substrate surface and into the at least one three-dimensional growth space, the nanorods having a solid cross-section along their lengths, wherein the plurality of nanorods are uniformly distributed on the substrate surface in the at least one growth space, the nanorod network characterized in that the nanorods are sufficiently dense and interlinked that they are able to provide a free-standing, nanorod network upon the removal of the substrate, wherein the free-standing, nanorod network is in the form of a tubular assemblage in which nanorods are merged at their roots.

6. A three-dimensional nanorod network comprising:
   (a) a substrate that defines at least one three-dimensional growth space having at least one nanoscale dimension; and
   (b) a plurality of single-crystalline nanorods extending outwardly from the substrate surface and into the at least one three-dimensional growth space, the nanorods having a solid cross-section along their lengths, wherein the plurality of nanorods are uniformly distributed on the substrate surface in the at least one growth space, and further wherein the at least one three-dimensional growth space comprises the inter-nanostructure volume defined by a matrix of nanostructures, wherein the average center-to-center distance between the nanostructures in the matrix is no greater than about 2 μm.

7. The nanorod network of claim 6, wherein the longest nanorods have lengths that are at least as long as the smallest dimension of the at least one growth space.

8. The nanorod network of claim 6, wherein the substrate and the nanorods are formed from different materials.

9. The nanorod network of claim 6, wherein the nanorods form a continuous coating on the surface of the substrate within the at least one growth space.

10. The nanorod network of claim 6 wherein the substrate defines a plurality of three-dimensional growth spaces comprising elongated channels having nanoscale diameters and the nanorods extend inwardly from the walls of the elongated channels.

11. The nanorod network of claim 10, wherein at least some of the nanorods are sufficiently long to extend across the diameter of the elongated channels.

12. The nanorod network of claim 10, wherein the average length of the nanorods within the channels does not change as a function of nanorod position along the length of the channels.

13. The nanorod network of claim 6, wherein at least some of the nanorods within the inter-nanostructure volume are sufficiently long to extend from one nanostructure of the matrix to another nanostructure of the matrix.

14. The nanorod network of claim 6, wherein the matrix of nanostructures comprises a matrix of aligned nanoscale pillars.

15. The nanorod network of claim 6, wherein the matrix of nanostructures comprises a matrix of nanoscale particles.

16. The nanorod network of claim 6, characterized in that the nanorods are sufficiently dense and interlinked that they are able to provide a free-standing, nanorod network upon the removal of the substrate.

17. The nanorod network of claim 6, wherein the at least one three-dimensional growth space comprises the inter-nanostructure volume defined by a regular array of pillars having nanoscale diameters.

18. The nanorod network of claim 6, wherein the at least one three-dimensional growth space comprises the inter-nanostructure volume defined by a regular array of nanospheres having nanoscale diameters.

19. The nanorod network of claim 6, wherein the substrate defines a plurality of three-dimensional growth spaces, the majority of the three-dimensional growth spaces having at least one nanoscale dimension.

20. The nanorod network of claim 6, wherein the average center-to-center distance between the nanostructures in the matrix is no greater than about 1 μm.

* * * * *

UNITED STATES PATENT AND TRADEMARK OFFICE
CERTIFICATE OF CORRECTION

PATENT NO. : 8,771,822 B2  
APPLICATION NO. : 13/008170  
DATED : July 8, 2014  
INVENTOR(S) : Xudong Wang et al.

Page 1 of 1

It is certified that error appears in the above-identified patent and that said Letters Patent is hereby corrected as shown below:

IN THE SPECIFICATION

Col. 11, Line 24 (equation 2)

Delete "—O—Ti—(OH)" and replace with -- —O—Ti—(OH)$_x$ --

Signed and Sealed this  
Seventeenth Day of March, 2015

Michelle K. Lee  
*Director of the United States Patent and Trademark Office*